(12) United States Patent
Frissen et al.

(10) Patent No.: US 6,891,600 B2
(45) Date of Patent: May 10, 2005

(54) LITHOGRAPHIC APPARATUS AND DEVICE MANUFACTURING METHOD

(75) Inventors: Petrus Carolus Maria Frissen, Beek (NL); Johan Cornelis Compter, Eindhoven (NL); Rob Tabor, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/457,788

(22) Filed: Jun. 10, 2003

(65) Prior Publication Data
US 2004/0036848 A1 Feb. 26, 2004

(30) Foreign Application Priority Data
Jun. 12, 2002 (EP) .............................................. 02254101

(51) Int. Cl.⁷ .......................... G03B 27/58; G03B 27/62
(52) U.S. Cl. .......................................... 355/72; 355/75
(58) Field of Search ............................... 355/53, 72–76; 310/10–13; 318/135; 378/34, 35; 250/442.11

(56) References Cited

U.S. PATENT DOCUMENTS

| | | | |
|---|---|---|---|
| 6,265,793 B1 * | 7/2001 | Korenaga ..................... 310/12 |
| 6,339,269 B1 * | 1/2002 | Hsiao ........................... 310/64 |
| 6,570,273 B2 * | 5/2003 | Hazelton ...................... 310/12 |
| 6,584,671 B2 * | 7/2003 | Miller et al. .................. 29/596 |
| 6,639,225 B2 * | 10/2003 | Kirschstein et al. ... 250/442.11 |
| 2002/0079461 A1 | 6/2002 | Kirschstein et al. ... 250/442.11 |

FOREIGN PATENT DOCUMENTS

| | | |
|---|---|---|
| EP | 1 189 018 A2 | 3/2002 |
| EP | 1 215 805 A2 | 6/2002 |
| EP | 1215805 * | 6/2002 |
| EP | 1 189 018 A3 | 4/2003 |
| WO | WO 02/060037 | 8/2002 |

OTHER PUBLICATIONS

Beckert et al., "Development of a vertical wafer stage for high–vacuum applications," *Microelectronic Engineering* 57–58:207–212 (2001).

* cited by examiner

*Primary Examiner*—Henry Hung Nguyen
(74) *Attorney, Agent, or Firm*—Pillsbury Winthrop LLP

(57) ABSTRACT

A coil for use in an actuator in a lithographic projection apparatus. The coil is formed of a strip of electrically conducting sheet-material that is wound round a winding axis. Respective turns of the strip of sheet-material are separated by an electrically non-conducting layer.

21 Claims, 4 Drawing Sheets

Prior Art

LITHOGRAPHIC APPARATUS AND DEVICE MANUFACTURING METHOD

This application claims priority to European Application No. 02254101.5, filed Jun. 12, 2002.

BACKGROUND OF THE INVENTION

1. Field of the Invention

The present invention relates generally to a lithographic projection apparatus and more particularly to a lithographic projection apparatus including electromagnetic actuators.

2. Description of the Related Art

The term "patterning means" or "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning means can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as hereabove set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

The positioning devices that are used in conventional lithographic apparatus to provide forces to move the mask table MT and the substrate table WT usually comprise a plurality of actuators. The actuators comprise of copper coils attached to one part of the apparatus and a magnet assembly attached to the other part of the apparatus. When a current is passed through such coil the interaction of the current passing through the coil and the magnetic field generated by the magnet produces a force between two parts of the apparatus. The coils of conventional actuators are formed from insulated wire that is wound in an orthocyclic fashion. FIG. 2 of the accompanying drawings depicts such a coil in cross section. The coil 10 is formed from copper wire 11 wound about a winding axis 12. To prevent short circuits between respective turns of the copper wire 11, the wire is encased in an electrically insulating material 13.

Temperature changes and temperature gradients within the lithographic apparatus reduce the accuracy of its performance and thermal strains may cause damage to components within the apparatus or the substrates being processed by the apparatus. It is therefore desirable to minimize the heat generated within the apparatus or, where this is not possible, remove the generated heat. The heat generated in the coil for a given force produced by the actuator may be reduced by using a larger coil. However this increases the mass of the actuator, resulting in larger required forces and more heat generated. Therefore, the coil 10 of the actuator is provided with cooling elements 14 which remove the heat generated by the current passing through the wire 11.

However, with conventional coil designs made up of orthocyclically wound wire, the heat transmission through the coil is low. Each insulated piece of wire is only in line-contact with the adjacent pieces of wire, limiting the area across which heat may be conducted. Furthermore, the material 13 used to electrically insulate the wires 11 from one another tends to be a poor conductor of heat further reducing the heat transfer characteristic across the coil as a whole. Consequently, a significant portion of the heat generated on the lower side 10b of the coil is dissipated to the environment 15 surrounding the coil, rather than being transferred through the coil to the cooling elements 14.

SUMMARY OF THE INVENTION

It is an object of the present invention to provide a coil for an actuator or positioning device for use in a lithographic projection apparatus that has improved heat transfer characteristics.

This and other objects are achieved according to the invention in a lithographic apparatus as specified in the opening paragraph, characterized in that said positioning device comprises a planar motor having a stator and a translator, one of said stator and said translator comprising a periodic magnet structure and the other of said stator and said translator comprising a plurality of coils that can carry an electric current, said coils comprise a strip of electrically conductive sheet-material.

This provides a coil with improved heat transfer characteristics since heat can be transferred across the width of the strips of electrically conductive sheet-material. This is beneficial because the electrically conductive material has a higher thermal conductivity than the insulating material used in conventional coil designs.

Preferably, the electrically conducting sheet-material itself forms the coil that carries the electrical current. Such a coil has a better space filling factor than conventional coils. For example the space filling factor of a coil according to this arrangement would be approximately 0.8 in comparison to 0.7 for conventional orthocyclically wound copper coils. This reduces the required dimensions and hence the weight of the coil for a given actuator requirement.

In a preferred embodiment, the coils are formed from aluminium sheet-material. An additional advantage of coils formed from aluminium is that, although the conductivity is lower than conventionally used copper, the lower density more than offsets this, resulting in lighter coils. This advantage could not be realized in conventional wire coils as aluminium is very difficult to draw into wires. This is in particular advantageous in case the coils are arranged on the translator of the planar motor and this motor is used to provide both horizontal forces and vertical forces. In such arrangement, the motor can easily be used in vacuum applications since the vertical force can be applied to levitate the translator from the magnet plate so that it can move frictionless in the horizontal plane without the requirement of e.g. an air bearing. In case the motor is to generate a vertical force in order to levitate above the surface of the magnet plate, the weight of the mover is to be kept as low as possible since this vertical force has to be provided at a 100% duty cycle during operation. The use of light weight aluminium foil coils is found to be advantageous for such applications.

Preferably, the successive turns of the coil are separated from each other by electrically non-conducting material that is integral to the surface of the sheet-material. For example, when the coil is formed of aluminium, an electrically non-conducting surface layer of $Al_2O_3$ can easily be formed on the surface. This simplifies the manufacture of the coils in comparison to providing a separate insulating layer between the turns of the conducting material. Furthermore, the production is more reliable since, with a separate insulating material, there is the risk that the insulator will be damaged in production which may lead to electrical short circuits between respective turns of the coil. Ideally the $Al_2O_3$ is at least 5 μm thick to ensure adequate electrical insulation, even if there is some physical damage to the $Al_2O_3$ layer.

The strip of sheet-material may be significantly narrower in a thickness direction, substantially perpendicular to the winding axis, than it is in the width direction, substantially parallel to the winding axis. This enables the coil to be formed from a large number of turns of the sheet-material without it becoming bulky whilst at the same time providing good heat conductivity across the width of the coil.

In an alternative arrangement, the current carrying coil is formed from wire and the strips of electrically conductive sheet-material are embedded in the wire coil. The sheet-material efficiently conducts the heat out of the coils without significantly reducing the space filling factor of the coil. The sheet-material may be arranged perpendicular to the winding axis or parallel to the winding axis. As before, in case aluminium is applied as the electrically conductive sheet-material, the $Al_2O_3$ layer on the surface of the sheet-material forms an integral electrical insulating layer to prevent the coil short-circuiting.

A cooling element may be attached to a side of the coil that forms a plane perpendicular to the winding axis such that an edge of the sheet-material is in thermal contact with the cooling element. Therefore the heat generated by the current in the coil will be transferred via a low thermal conductivity path to the cooling element, minimizing the amount of heat that is radiated or conducted to the environment surrounding the coil.

Preferably an impact protection member is attached to a side of the coil that forms a plane perpendicular to the winding axis, for example, the opposite side of the coil to the one on which the cooling element is attached. This is especially useful where the coil is used in a planar motor, since the impact protection member will minimize any damage to the coils should they for any reason collide with the stator of the planar motor. The impact protection member may also isolate the coil from the remainder of the apparatus. The actuator may be located in an evacuated system. Therefore, were the coil not isolated from the vacuum, the $Al_2O_3$ layer would outgas gases that had previously been absorbed within it.

In a further variant of the invention, the coil is wound about a ferromagnetic core. This enables the construction of an actuator with a lower volume for a given force and a consequent improvement in the motor efficiency.

According to a further aspect of the invention there is provided a device manufacturing method comprising the steps of:
  providing a substrate that is at least partially covered by a layer of radiation-sensitive material;
  providing a projection beam of radiation using a radiation system;
  using patterning means to endow the projection beam with a pattern in its cross-section;
  projecting the patterned beam of radiation onto a target portion of the layer of radiation-sensitive material,
  characterized by passing an electric current through a coil in an actuator, producing a force between two components in the device manufacturing apparatus; wherein said coil comprises a strip of electrically conductive sheet-material.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiment 1

Figure 1:
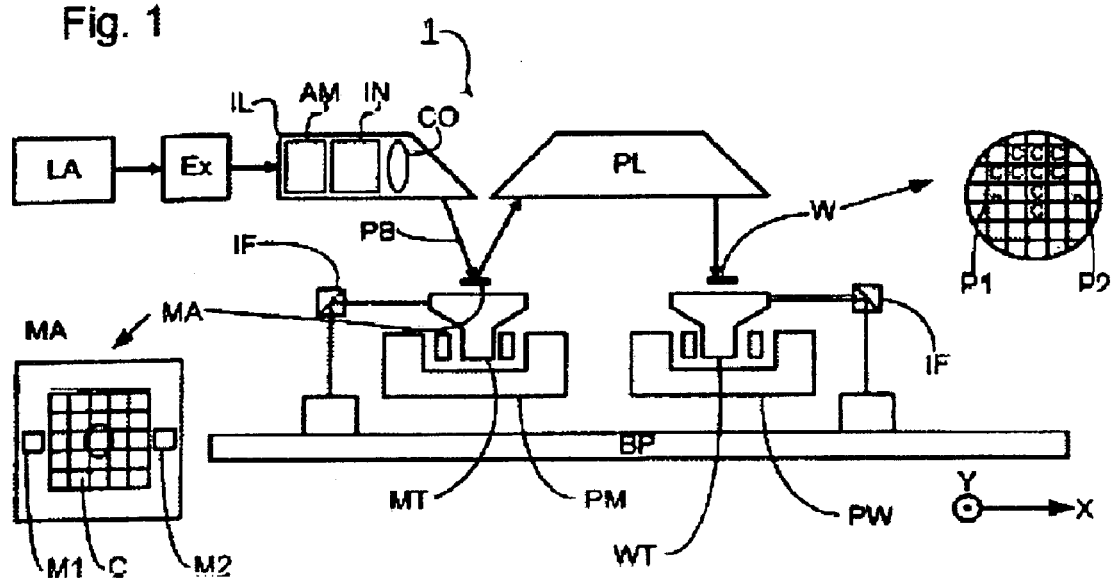
FIG. 1 depicts a lithographic projection apparatus according to an embodiment of the invention.
Figure 2:
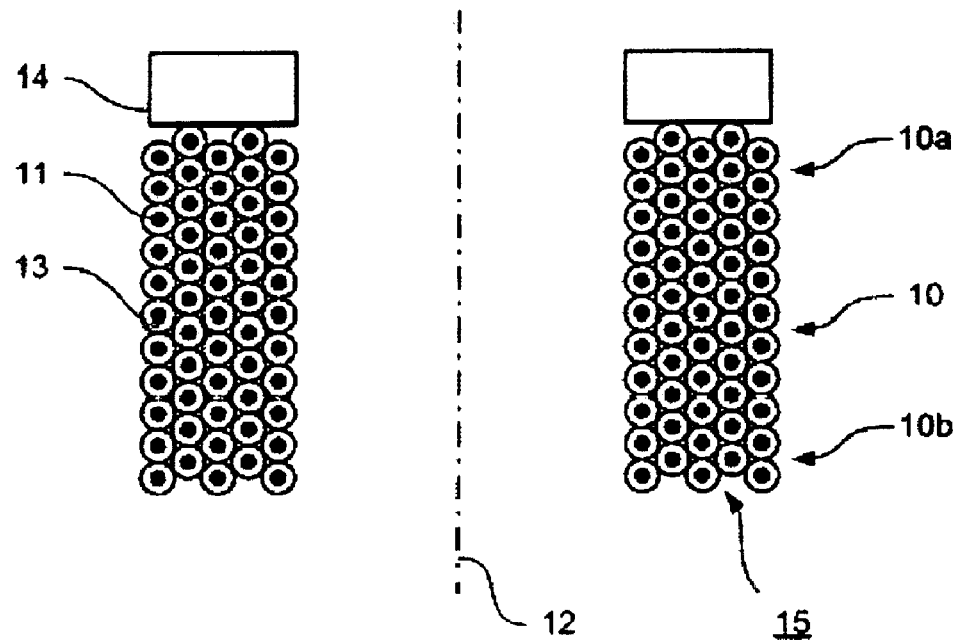
FIG. 2 depicts, in cross section, a conventional coil.

FIG. 1 schematically depicts a lithographic projection apparatus according to a particular embodiment of the invention. The apparatus comprises:
  a radiation system Ex, IL, for supplying a projection beam PB of radiation (e.g. EUV radiation), which in this particular case also comprises a radiation source LA;
  a first object table (mask table) MT provided with a mask holder for holding a mask MA (e.g. a reticle), and connected to first positioning means for accurately positioning the mask with respect to item PL;
  a second object table (substrate table) WT provided with a substrate holder for holding a substrate W (e.g. a resist-coated silicon wafer), and connected to second positioning means for accurately positioning the substrate with respect to item PL;
  a projection system ("lens") PL (e.g. mirror group) for imaging an irradiated portion of the mask MA onto a target portion C (e.g. comprising one or more dies) of the substrate W.

As here depicted, the apparatus is of a reflective type (e.g. has a reflective mask). However, in general, it may also be of a transmissive type, for example (e.g. with a transmissive mask). Alternatively, the apparatus may employ another kind of patterning means, such as a programmable mirror array of a type as referred to above.

The source LA (e.g. a laser-produced or discharge plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 3:
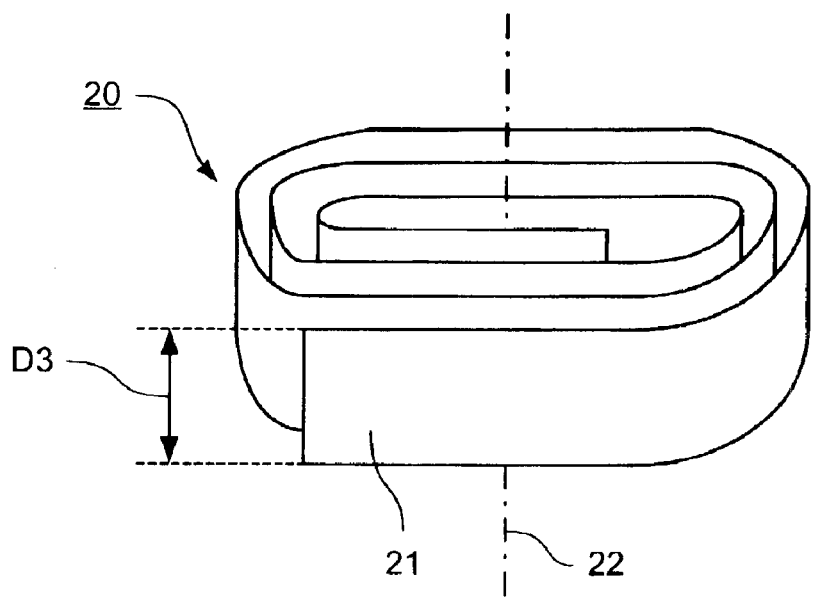
FIG. 3 depicts, in perspective, a coil according to the present invention.

FIG. 3 depicts, in perspective, a coil 20 according to the present invention. The coil 20 is formed from an elongate strip 21 of electrically-conductive sheet-material or foil wound about a winding axis 22.

Figure 4:
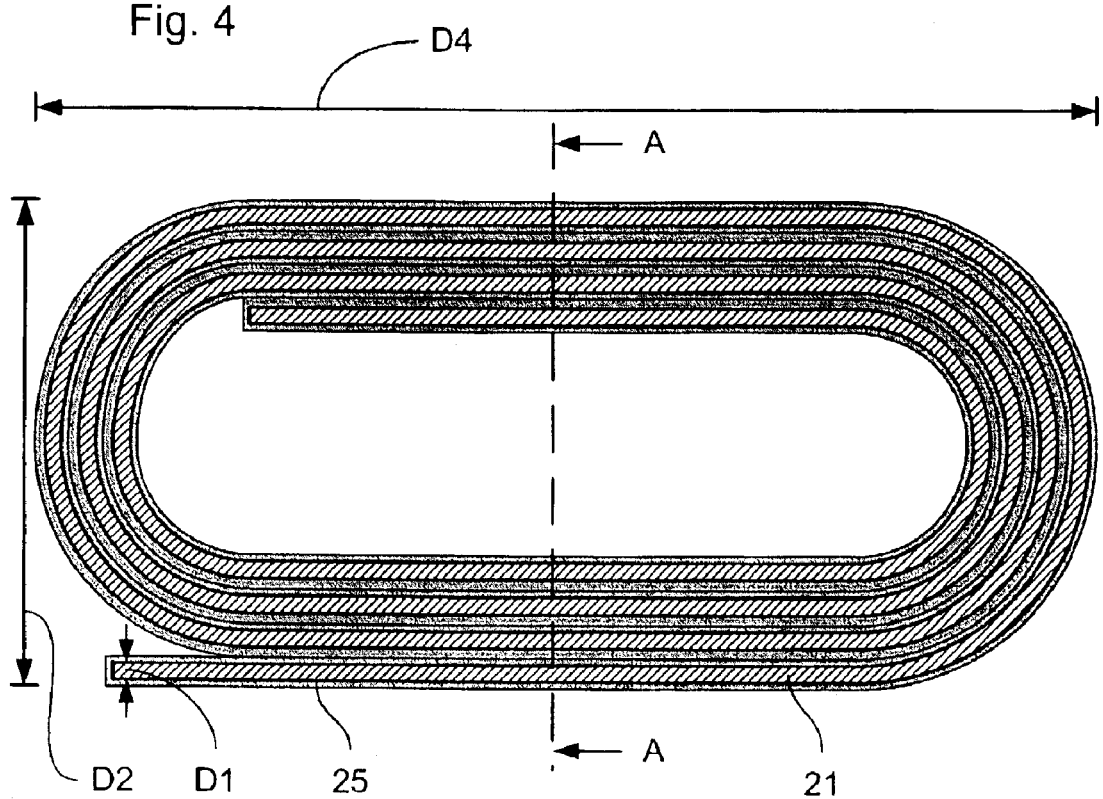
FIG. 4 depicts, in plan view, a coil according to the present invention.

FIG. 4 depicts the coil in plan view. As shown the coil may be elongate in shape. Alternatively, it may be rectangular or square in shape, depending on its use. The thickness D1 of the sheet-material is minimized in order to maximize the number of turns that can be arranged in the maximum external width D2 of the coil. This will be determined by the space available for the actuator within the lithographic apparatus. The width D3 of the strip 21 from which the coil 20 is formed is then determined from the required cross sectional area of the strip in turn determined from the required electrical resistance of the coil.

The coil is preferably formed from aluminium strips with a thickness D1 preferably between 50 and 150 $\mu$m. In a preferred configuration the strips are approximately 60 $\mu$m thick. The width D3 of the strip of material is preferably between approximately 3 mm to 20 mm. In a preferred configuration the width of the strip of aluminium is approximately 10 mm. Each coil may comprise between 100 and 300 turns and have a maximum external width D2 of approximately 40 mm and a maximum external length D4 of approximately 350 mm. The coil may also be formed from other electrically-conductive materials that can be formed into the required shape, such as copper.

In order to prevent electrical short circuits between respective turns of the coil, electrically non-conducting material must be provided between the turns. This may be in the form of a separate insulating layer bonded to the strip 21 of electrically conducting material before it is wound into the coil shape. Preferably, however, as shown in FIG. 4, the strip 21 of electrically conducting material has an integral surface 25 formed on it of electrically non-conducting material. When the strip 21 is wound into the coil shape, the electrically non-conducting surface 25 prevents electrical short circuits between respective turns of the coil. When the coil is formed from aluminium, the integral surface 25 may be formed of $Al_2O_3$. This can preferably be formed by anodizing the aluminum or, alternatively by chemical processes or by exposing the surface to oxygen. The anodizing process may, advantageously, be controlled to produce a uniform thickness of $Al_2O_3$ on the surface of the aluminium strip 21. Preferably the thickness of the $Al_2O_3$ layer is at least approximately 5 $\mu$m. It has been found that the risk of short-circuits between different turns of the coil during manufacturing or machining of the coil is much less for aluminium foil coils compared to e.g. Cu foil coils.

Figure 5:
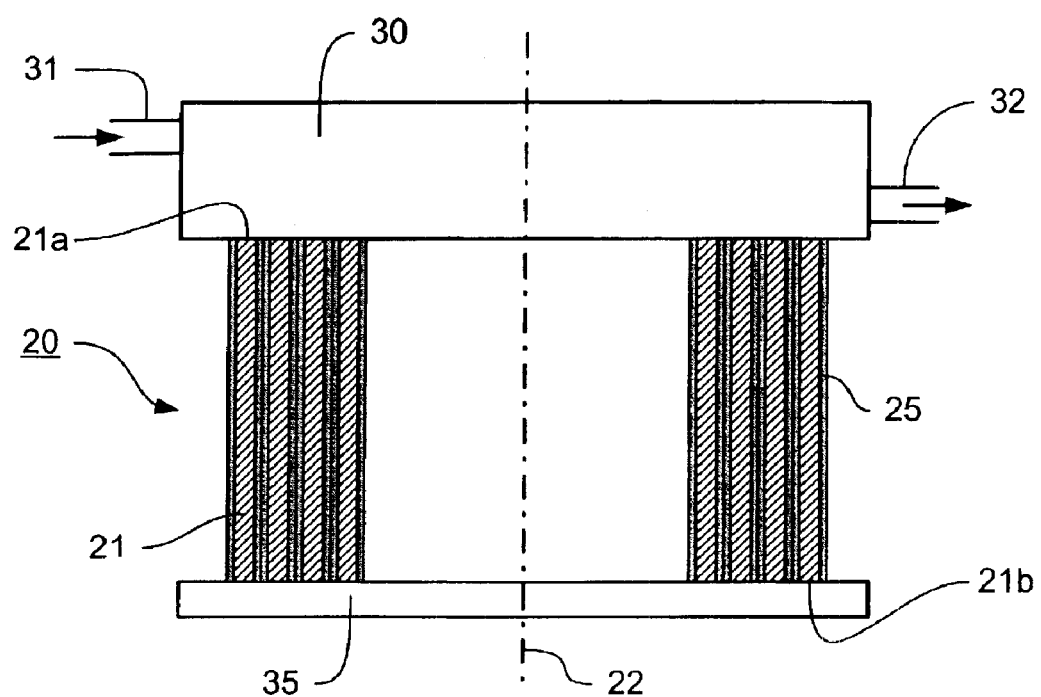
FIG. 5 depicts the coil of FIG. 4 across the section AA.

FIG. 5 shows the cross section AA, marked on FIG. 4. A cooling element 30 (not shown in FIGS. 3 and 4) is attached to the upper side of the coil 20. A flow of coolant is provided to an inlet 31 and extracted from an outlet 32 to remove the heat absorbed by the cooling element 30. The cooling element 30 is in direct thermal contact with the top edge 21a of the strip 21 of sheet-material from which the coil material is formed. Therefore, the heat generated in the coil 20 by the current passing through it may be transferred directly from the strip of sheet-material to the cooling element 30 without being transferred across a significant section of insulating material (a thin layer of insulating material may be necessary between the top edge 21a of the strip of sheet-material and the cooling element 30 to prevent short circuits between respective turns of the coil).

Figure 6:
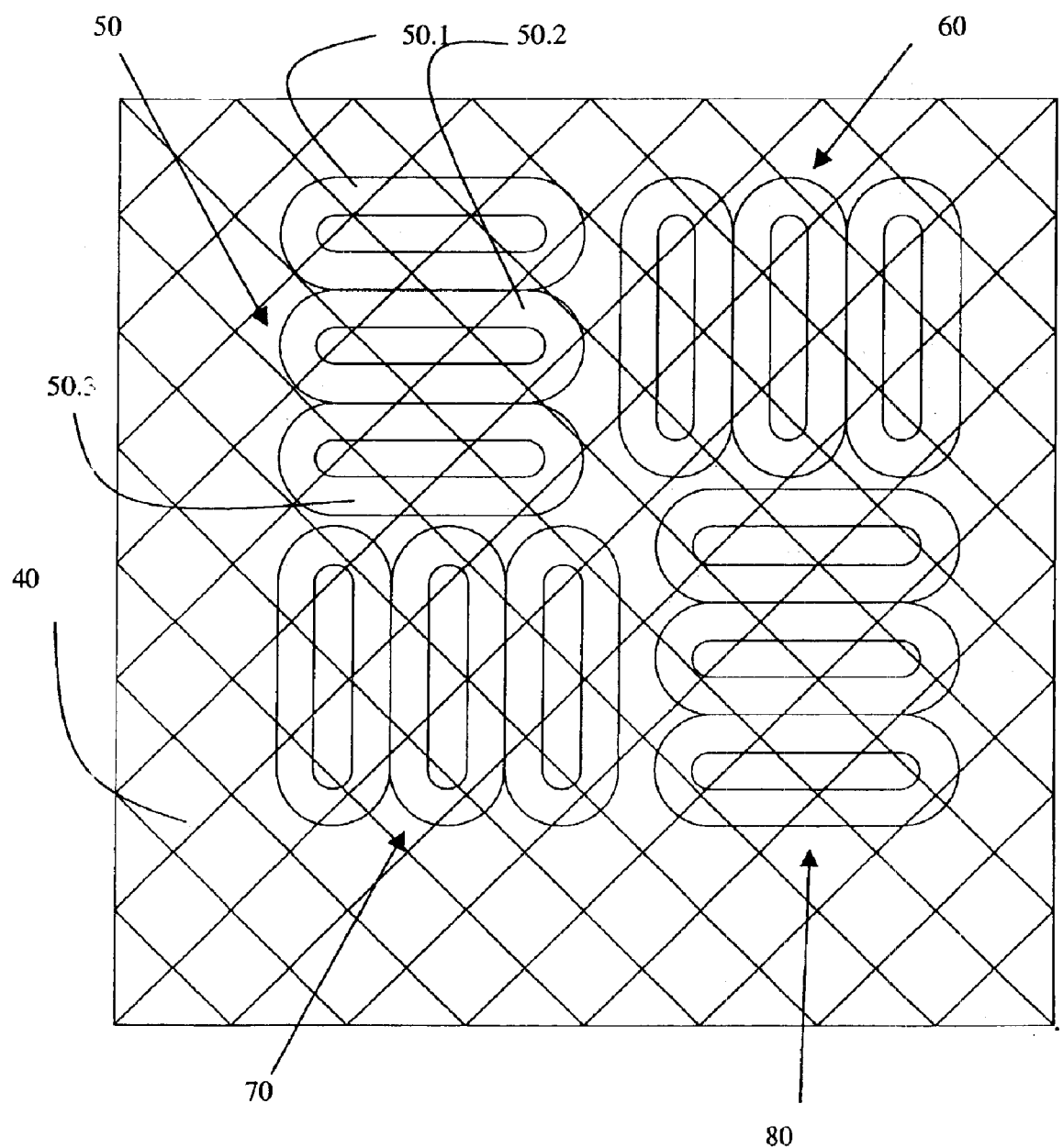
FIG. 6 schematically depicts an arrangement of different coil units according to the present invention.

A plate 35 of stainless steel may be attached to the lower edge 21b of the strip 21 of sheet-material to prevent damage to the coil from any impact. This is especially useful since the coil may be used as part of a planar motor in which case the coil must be protected from damage caused by, for example, collisions with the stator of the planar motor. Preferable, when the actuator or motor comprises more than one coil, one plate 35 should cover all coils rather than having a separate plate for each coil. As an example, the planar motor may comprise of a magnet plate and a mover comprising different coil units, each coil unit comprising a plurality of coils. FIG. 6 schematically depicts a possible layout of such planar motor. The magnet plate of the motor (40) is schematically represented by the diagonal lines forming a pattern of squares. The mover or translator of the planar motor is schematically depicted by 12 coils arranged in 4 coil units (50, 60, 70, 80), each coil unit comprising three coils (50.1, 50.2, 50.3). Such a planar motor arrangement is well suited to be used in vacuum applications since the motor can generate a horizontal force for acceleration and deceleration, but also a vertical force to levitate the mover from the magnet plate so that it can move frictionless in the horizontal plane. Therefore, a separated bearing is not required. In case the motor is to generate a vertical force in order to levitate above the surface of the magnet plate, the weight of the mover is to be kept as low as possible since this vertical force has to be provided at a 100% duty cycle during operation. The use of light weight aluminium foil coils is found to be advantageous for such applications. Further information on such planar motors may be found in WO 01/18944A, which is incorporated herein by reference. The plate 35 may, alternatively, be formed from other materials.

In order to improve the force provided by an actuator and/or the motor efficiency, a ferromagnetic core may be added to the coil. For instance, the coil may be wound about the core which, in this case, will be centered on the winding axis of the coil. The core may be formed of laminated, powdered or solid iron or ferromagnetic alloy. Where more than one coil is provided (for instance if the actuator has more than one phase), each coil may have a separate core or the cores may be connected.

In a variant of the present invention, a wire coil as used in conventional coils is used but with sheet-material embedded within it. The sheet-material has little impact on the space filling factor of the coil but provides direct thermal paths through the coil to remove heat generated within it. In a preferred embodiment, the sheet-material used is aluminium since it has good thermal conducting properties and an oxide layer can easily be formed on its surface to provide electrical insulation from the coils. The mechanically strong insulation layer formed by the aluminium oxide reduces the risk of insulation damage. The sheet-material may be added to the coil as the wire is wound to form the coil. One or more layers of sheet-material may be arranged between layers of the turns of the coil such that the sheet-material is perpendicular to the winding axis of the coil. Alternatively and/or additionally, strips of sheet-material may be provided parallel to the winding axis such that each strip is perpendicular to a plane that itself is perpendicular to the winding axis. Such strips are located, for instance, between some turns of the coil (inner turns) that are closer to the winding axis than the sheet-material and some turns that are further away from the winding axis (outer turns). The strips may comprise substantially straight sections of sheet-material or may comprise sections that curve with the coil. As before, the strips of sheet material may be connected to a cooling element. In case the strips of sheet material are provided parallel to the winding axis of the coil, this results in an improved behavior with respect to Eddy currents. A reduction in Eddy currents may result in an improved dynamic behavior of the actuator or motor.

Whilst specific embodiments of the invention have been described above, it will be appreciated that the invention may be practiced otherwise than as described. The description is not intended to limit the invention.

What is claimed is:

1. A lithographic projection apparatus comprising:
   a radiation system to provide a beam of radiation;
   a support structure to support patterning structure that patterns the beam of radiation according to a desired pattern;
   a substrate table to hold a substrate;
   a projection system to project the patterned beam onto a target portion of the substrate; and
   a positioning device to position at least one of said support structure and said substrate table, the positioning device including a planar motor having a stator and a translator, one of the stator and the translator comprising a periodic magnet structure and another of the stator and the translator comprising a plurality of coils that are adapted to carry an electric current, the coils comprising a strip of electrically conducting sheet-material,
   wherein the strip of electrically conducting sheet material is wound about a winding axis to form the coil for carrying said electric current, and
   wherein said planar motor comprises an impact protection member attached to a side of the coils that forms a plane perpendicular to the winding axis and configured to prevent damages to the coils caused by one of said stator and translator.

2. A lithographic projection apparatus according to claim 1, wherein the electrically conducting sheet-material is aluminum.

3. A lithographic projection apparatus according to claim 2, wherein successive turns of the coil are separated from each other by a layer of electrically non-conducting $Al_2O_3$ that is integral to the surface of the sheet-material.

4. A lithographic projection apparatus according to claim 3, wherein a thickness of the $Al_2O_3$ layer is at least 5 $\mu$m.

5. A lithographic projection apparatus according to claim 1, wherein the strip of sheet-material is narrower in a thickness direction, substantially perpendicular to said winding axis, than it is in a width direction, substantially parallel to the winding axis.

6. A lithographic projection apparatus according to claim 1, wherein said sheet-material is between approximately 50 $\mu$m and approximately 150 $\mu$m in thickness in a thickness direction substantially perpendicular to the winding axis.

7. A lithographic projection apparatus according to claim 1, wherein said sheet-material is approximately 60 $\mu$m in thickness in a thickness direction substantially perpendicular to the winding axis.

8. A lithographic projection apparatus according claim 1, wherein a width of said strip of electrically-conductive sheet-material, in a direction substantially parallel to the winding axis, is between approximately 3 mm and approximately 20 mm.

9. A lithographic projection apparatus according to claim 1, wherein said planar motor further comprises a cooling element attached to and in thermal contact with the electrically conductive sheet-material.

10. A lithographic projection apparatus comprising:
    a radiation system to provide a beam of radiation;
    a support structure to support a patterning structure that patterns the beam of radiation according to a desired pattern;
    a substrate table to hold a substrate;
    a projection system to project the patterned beam onto a target portion of the substrate; and
    an actuator constructed and arranged to produce a force between two components in the apparatus when electric current is passed through a coil of the actuator, the coil comprising a wire coil wound about a winding axis and wherein a strip of electrically conductive sheet-material is embedded in the wire coil such that it is substantially parallel to the winding axis of the coil.

11. A lithographic projection apparatus comprising:
    a radiation system to provide a beam of radiation;
    a support structure to support patterning structure that patterns the beam of radiation according to a desired pattern;
    a substrate table to hold a substrate;
    a projection system to project the patterned beam onto a target portion of the substrate; and
    an actuator constructed and arranged to produce a force between two components in the apparatus when electric current is passed through a coil of the actuator, the coil comprising a wire coil wound about a winding axis and wherein a strip of aluminum sheet-material is embedded in the wire coil.

12. A lithographic projection apparatus according to claim 11, wherein a layer of electrically non-conducting $Al_2O_3$ that is integral to the surface of the aluminum sheet-material is formed on its surface.

13. A lithographic projection apparatus according to claim 12, wherein a thickness of the $Al_2O_3$ layer is at least 5 μm.

14. A lithographic projection apparatus according to claim 10, wherein the actuator further comprises a cooling element attached to and in thermal contact with the electrically conductive sheet-material.

15. A lithographic projection apparatus according to claim 10, wherein said sheet-material is between approximately 50 μm and approximately 150 μm in thickness.

16. A lithographic projection apparatus according to claim 10, wherein said sheet-material is approximately 60 μm in thickness.

17. A lithographic projection apparatus according to claim 10, wherein a width of said strip of electrically-conductive sheet-material, in a direction substantially parallel to the winding axis, is between approximately 3 mm and approximately 20 mm.

18. A device manufacturing method comprising:

projecting a patterned beam of radiation onto a target portion of a layer of radiation-sensitive material on a substrate in a lithographic projection apparatus; and producing a force between movable components of the lithographic projection apparatus by passing an electric current through a coil portion of an actuator, the coil portion of the actuator comprising a strip of electrically conductive sheet-material, wherein the strip of electrically conducting sheet material is wound about a winding axis to form the coil for carrying said electric current, and wherein an impact protection member is attached to a side of the coil portion that forms a plane perpendicular to the winding axis and configured to prevent damages to the coils caused by parts of said actuator.

19. An apparatus according to claim 1, wherein said impact protection member includes a plate substantially covering said side of the coils.

20. An apparatus according to claim 1, wherein said plate includes a stainless steel plate.

21. An apparatus according to claim 8, wherein said cooling element is attached to another side of the coils opposite said side of the coils.

* * * * *